US012461130B2

(12) United States Patent
Holzmann

(10) Patent No.: US 12,461,130 B2
(45) Date of Patent: Nov. 4, 2025

(54) LOAD CURRENT SENSING IN A SWITCHED DRIVER STAGE

(71) Applicant: Nuvoton Technology Corporation, Hsinchu (TW)

(72) Inventor: Peter Holzmann, San Jose, CA (US)

(73) Assignee: Nuvoton Technology Corporation, Hsinchu (TW)

( * ) Notice: Subject to any disclaimer, the term of this patent is extended or adjusted under 35 U.S.C. 154(b) by 140 days.

(21) Appl. No.: 18/420,763

(22) Filed: Jan. 24, 2024

(65) Prior Publication Data

US 2025/0237680 A1 Jul. 24, 2025

(51) Int. Cl.
*G01R 19/00* (2006.01)
*H03F 1/02* (2006.01)
*H03F 3/217* (2006.01)
*H03F 3/45* (2006.01)

(52) U.S. Cl.
CPC ....... *G01R 19/0092* (2013.01); *H03F 1/0255* (2013.01); *H03F 3/2171* (2013.01); *H03F 3/45475* (2013.01)

(58) Field of Classification Search
None
See application file for complete search history.

(56) References Cited

U.S. PATENT DOCUMENTS

2008/0238540 A1* 10/2008 Wu ........................ H03F 3/217
330/10

OTHER PUBLICATIONS

Angelo Nagari et al., "An 8Ω 2.5 W 1%-THD 104 dB(A)-Dynamic-Range Class-D Audio Amplifier With Ultra-Low EMI System and Current Sensing for Speaker Protection", published on IEEE Journal of Solid-State Circuits, vol. 47, No. 12, Dec. 2012.
Marco Berkhout et al., "A 4Ω 2.65W Class-D Audio Amplifier With Embedded DC-DC Boost Converter, Current Sensing ADC and DSP for Adaptive Speaker Protection", published on IEEE Journal of Solid-State Circuits, vol. 48, No. 12, Dec. 2013.

* cited by examiner

*Primary Examiner* — Jas A Sanghera
(74) *Attorney, Agent, or Firm* — Kilpatrick Townsend & Stockton LLP

(57) ABSTRACT

A class-D amplifier includes an output driver stage and a current sensing circuit connected. The current sensing circuit includes: an operational amplifier having a positive input terminal and a negative input terminal; a positive input replica transistor, where a source of the positive input replica transistor is connected to the positive input terminal, a drain and a gate of the positive input replica transistor is connected to the drain and the gate of a first n-type output transistor, respectively; and a negative input replica transistor, where a source of the negative input replica transistor is connected to the negative input terminal, a drain and a gate of the negative input replica transistor is connected to the drain and the gate of the second n-type output transistor, respectively.

20 Claims, 12 Drawing Sheets

LOAD CURRENT SENSING IN A SWITCHED DRIVER STAGE

FIELD

This invention relates to the field of electronic circuits in audio systems. More particularly, the present invention relates to load current sensing in a switched driver stage of a class-D amplifier.

BACKGROUND

A class-D amplifier, also known as a switching amplifier, is an electronic amplifier in which transistors operate as binary switches. They are either fully on or fully off. Class-D amplifiers employ rail-to-rail output switching, where, ideally, their output transistors virtually always carry either zero current or zero voltage. Thus, their power dissipation is minimal, and they provide high efficiency over a wide range of power levels. Their advantageous high efficiency has propelled their use in various audio applications, from cell phones to flat screen televisions and home theater receivers. Class-D audio power amplifiers are more efficient than class-AB audio power amplifiers. Because of their greater efficiency, class-D amplifiers require smaller power supplies and eliminate heat sinks, thus significantly reducing overall system costs, size, and weight.

BRIEF SUMMARY OF THE INVENTION

One general aspect includes a class-D amplifier. The class-D amplifier includes an output driver stage may include: a first pull-up output transistor, where a drain or source of the first pull-up output transistor is connected to a higher power rail; a first n-type output transistor, where a drain of the first n-type output transistor is connected to a drain or source of the first pull-up output transistor at a first output terminal, and a source of the first n-type output transistor is connected to a lower power rail; a second pull-up output transistor, where a drain or source of the second pull-up output transistor is connected to the higher power rail; and a second n-type output transistor, where a drain of the second n-type output transistor is connected to a drain or source of the second pull-up output transistor at a second output terminal, and a source of the second n-type output transistor is connected to a lower power rail.

The class-D amplifier also includes a current sensing circuit connected to the first output terminal and the second output terminal. The current sensing circuit includes: an operational amplifier having a positive input terminal and a negative input terminal; a positive input replica transistor, where a source of the positive input replica transistor is connected to the positive input terminal of the operational amplifier, a drain of the positive input replica transistor is connected to the drain of the first n-type output transistor, and a gate of the positive input replica transistor is connected to a gate of the first n-type output transistor; and a negative input replica transistor, where a source of the negative input replica transistor is connected to the negative input terminal of the operational amplifier, a drain of the negative input replica transistor is connected to the drain of the second n-type output transistor, and a gate of the negative input replica transistor is connected to a gate of the second n-type output transistor.

Implementations may include one or more of the following features. In some embodiments, the operational amplifier further has a positive output terminal and a negative output terminal, and the current sensing circuit further may include: a first feedback resistor and a first feedback capacitor connected in parallel between the negative input terminal and the positive output terminal of the operational amplifier; and a second feedback resistor and a second feedback capacitor connected in parallel between the positive input terminal and the negative output terminal of the operational amplifier. In some embodiments, the first feedback resistor and the second feedback resistor have the same resistance, and the first feedback capacitor and the second feedback capacitor have the same capacitance.

In some embodiments, the positive output terminal and the negative output terminal of the operational amplifier are connected to an analog to digital converter (ADC).

In some embodiments, the current sensing circuit further may include: a first inverter, an input terminal of the first inverter connected to the gate of the first n-type output transistor; and a positive secondary replica transistor, where a source of the positive secondary replica transistor is connected to the source of the positive input replica transistor at the positive input terminal of the operational amplifier, a drain of the positive secondary replica transistor is connected to the lower power rail, and a gate of the positive secondary replica transistor is connected to an output terminal of the first inverter.

In some embodiments, the current sensing circuit further may include: a second inverter, an input terminal of the second inverter connected to the gate of the second n-type output transistor; and a negative secondary replica transistor, where a source of the negative secondary replica transistor is connected to the source of the negative input replica transistor at the negative input terminal of the operational amplifier, a drain of the negative secondary replica transistor is connected to the lower power rail, and a gate of the negative secondary replica transistor is connected to an output terminal of the second inverter.

In some embodiments, the first n-type output transistor is characterized by a first channel width and a first channel length, and the positive input replica transistor is characterized by a second channel width and a second channel length, and where a first ratio of the first channel width to the first channel length is different from a second ratio of the second channel width to the second channel length. In some embodiments, the first channel width is larger than the first channel length, and the second channel width is smaller than the second channel length.

In some embodiments, the second n-type output transistor is characterized by a third channel width and a third channel length, and the negative input replica transistor is characterized by a fourth channel width and a fourth channel length, and where a third ratio of the third channel width to the third channel length is different from a fourth ratio of the fourth channel width to the fourth channel length. In some embodiments, the third channel width is larger than the third channel length, and the fourth channel width is smaller than the fourth channel length.

In some embodiments, the first n-type output transistor, the second n-type output transistor, the positive input replica transistor, and the negative input replica transistor are located at a same chip. In some embodiments, the first n-type output transistor, the second n-type output transistor, the positive input replica transistor, and the negative input replica transistor are fabricated at a same process corner.

In some embodiments, the positive secondary replica transistor is characterized by a fifth channel width and a fifth channel length, and where a fifth ratio of the fifth channel width to the fifth channel length is the same as the second ratio of the second channel width to the second channel length.

In some embodiments, the negative secondary replica transistor is characterized by a sixth channel width and a sixth channel length, and where a sixth ratio of the sixth channel width to the sixth channel length is the same as the fourth ratio of the fourth channel width to the fourth channel length. The positive input replica transistor, the negative input replica transistor, the positive secondary replica transistor, and the negative secondary replica transistor are fabricated at a same process corner.

Another general aspect includes a method for operating a class-D amplifier. The method includes providing a class-D amplifier, the class-d amplifier may include an output driver stage, which includes a first pull-up output transistor, where a source or drain of the first pull-up output transistor is connected to a higher power rail; a first n-type output transistor, where a drain of the first n-type output transistor is connected to a drain or source of the first pull-up output transistor at a first output terminal, and a source of the first n-type output transistor is connected to a lower power rail; a second pull-up output transistor, where a source or drain of the second p-type output transistor is connected to the higher power rail; and a second n-type output transistor, where a drain of the second n-type output transistor is connected to a drain or source of the second pull-up output transistor at a second output terminal, and a source of the second n-type output transistor is connected to a lower power rail.

The class-D amplifier also includes a current sensing circuit connected to the first output terminal and the second output terminal and may include: an operational amplifier having a positive input terminal and a negative input terminal; a positive input replica transistor, where a source of the positive input replica transistor is connected to the positive input terminal of the operational amplifier, a drain of the positive input replica transistor is connected to the drain of the first n-type output transistor, and a gate of the positive input replica transistor is connected to a gate of the first n-type output transistor; and a negative input replica transistor, where a source of the negative input replica transistor is connected to the negative input terminal of the operational amplifier, a drain of the negative input replica transistor is connected to the drain of the second n-type output transistor, and a gate of the negative input replica transistor is connected to a gate of the second n-type output transistor.

The method also includes measuring a first output voltage across the positive output terminal and the negative output terminal of the operational amplifier for a first period, when the first p-type output transistor is turned off, the first n-type output transistor is turned on, the second p-type output transistor is turned on, and the second n-type output transistor is turned off.

The method also includes measuring a second output voltage across the positive output terminal and the negative output terminal of the operational amplifier for a second period, when the first pull-up output transistor is turned on, the first n-type output transistor is turned off, the second pull-up output transistor is turned on, and the second n-type output transistor is turned off.

The method also includes measuring a third output voltage across the positive output terminal and the negative output terminal of the operational amplifier for a third period, when the first pull-up output transistor is turned off, the first n-type output transistor is turned on, the second pull-up output transistor is turned off, and the second n-type output transistor is turned on.

Implementations may include one or more of the following features. The method may include: determining a sensed load current based on the first output voltage, the second output voltage, and the third output voltage.

In some embodiments, the first n-type output transistor is characterized by a first channel width and a first channel length, and the positive input replica transistor is characterized by a second channel width and a second channel length, and where a first ratio of the first channel width to the first channel length is different from a second ratio of the second channel width to the second channel length.

In some embodiments, the second n-type output transistor is characterized by a third channel width and a third channel length, and the negative input replica transistor is characterized by a fourth channel width and a fourth channel length, and where a third ratio of the third channel width to the third channel length is different from a fourth ratio of the fourth channel width to the fourth channel length.

Another general aspect includes a class-D amplifier with embedded current sensing. The class-D amplifier includes an output driver stage. The output driver stage includes: a first pull-up output transistor, where a source or drain of the first p-type output transistor is connected to a higher power rail; a first n-type output transistor, where a drain of the first n-type output transistor is connected to a drain or source of the first pull-up output transistor at a first output terminal, and a source of the first n-type output transistor is connected to a lower power rail; a second pull-up output transistor, where a source of the second pull-up output transistor is connected to the higher power rail; and a second n-type output transistor, where a drain of the second n-type output transistor is connected to a drain or source of the second pull-up output transistor at a second output terminal, and a source of the second n-type output transistor is connected to a lower power rail.

The amplifier also includes a current sensing circuit connected to the first output terminal and the second output terminal. The current sensing circuit includes: an operational amplifier having a positive input terminal and a negative input terminal, a positive input replica transistor connected between the drain of the first n-type output transistor and the positive input terminal, and a negative input replica transistor connected between the drain of the second n-type output transistor and the negative input terminal.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION OF THE DISCLOSURE

Figure 1A:
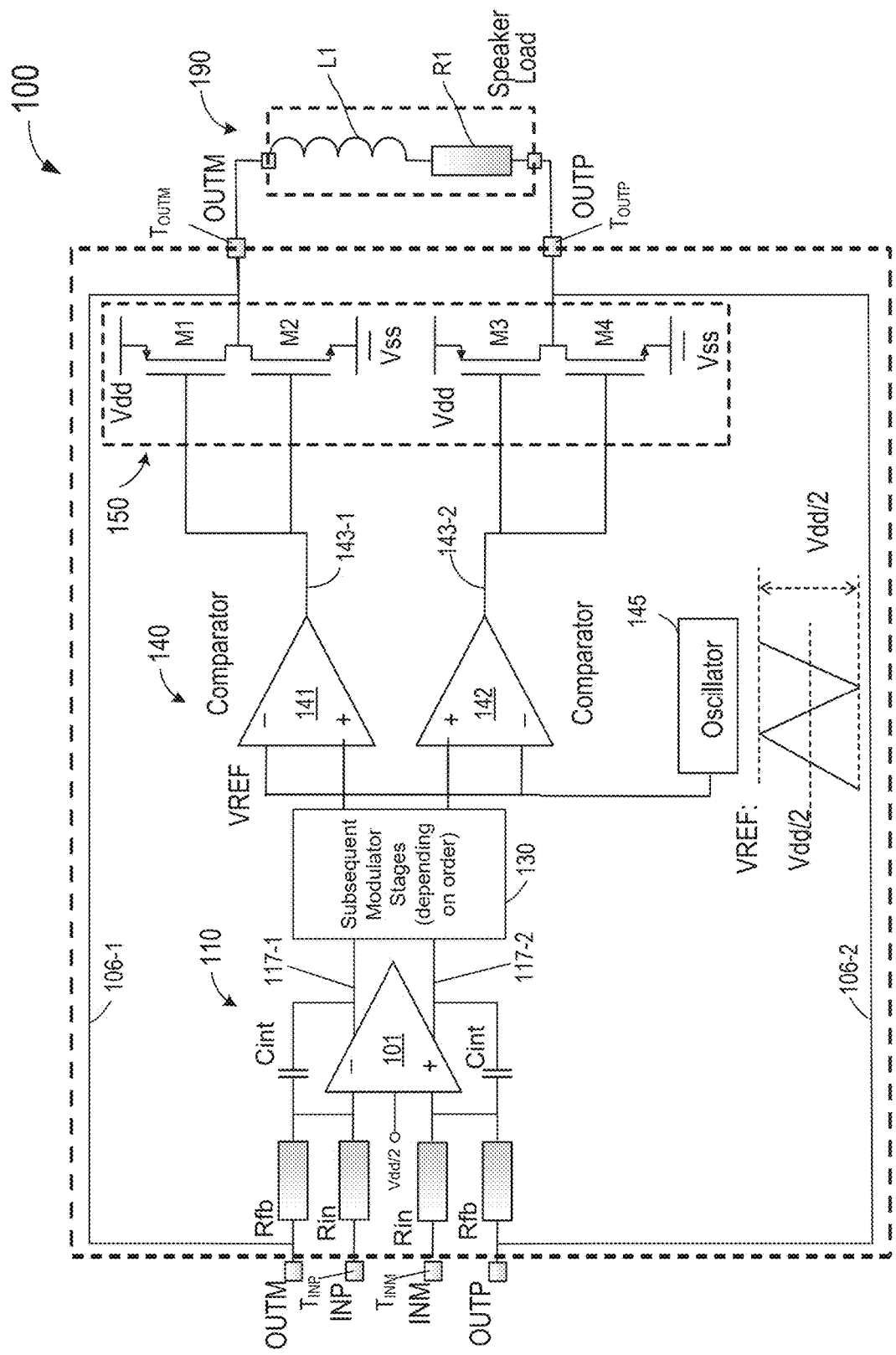
FIG. 1A is a simplified schematic diagram illustrating a class-D amplifier, which is a conventional class-D amplifier with a feedback loop.

The following disclosure provides many different embodiments, or examples, for implementing different features of the subject matter provided. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, source/drain ("S/D") region(s) may refer to a source or a drain, individually or collectively dependent upon the context. For example, a device may include a first source/drain region and a second source/drain region, among other components. The first source/drain region may be a source region, whereas the second source/drain region may be a drain region, or vice versa. One of ordinary skill in the art would recognize many variations, modifications, and alternatives.

Some embodiments of the disclosure are described. Additional operations can be provided before, during, and/or after the stages described in these embodiments. Some of the stages that are described can be replaced or eliminated for different embodiments. Some of the features described below can be replaced or eliminated and additional features can be added for different embodiments. Although some embodiments are discussed with operations performed in a particular order, these operations may be performed in another logical order.

Class D audio power amplifiers convert audio input signal into high-frequency pulses that switch the output transistors in accordance with the audio input signal. Some class-D amplifiers use pulse width modulators (PWM) to generate a series of conditioning pulses that vary in width according to the amplitude of the audio input signal. The width-varying pulses switch the output transistors at a fixed frequency. Other class-D amplifiers may rely upon other types of pulse modulators. The following discussion will mainly refer to pulse width modulators, but a person of ordinary skill in the art will recognize that class-D amplifiers may be configured with other types of modulators.

FIG. 1A is a simplified schematic diagram illustrating a class-D amplifier 100, which is a conventional class-D amplifier with a feedback loop. As shown in FIG. 1A, the class-D amplifier 100 is a differential amplifier (i.e., in a differential configuration). The class-D amplifier 100 includes, among other components, a differential input integrator 110, subsequent modulator stages 130, a PWM modulator stage 140, and an output driver stage 150.

A pair of differential audio input signals INP and INM (i.e., a first audio input signal INP and a second audio input signal INM) are provided at a first input terminal $T_{INP}$ and a second input terminal $T_{INM}$, respectively. The first audio input signal INP and the second audio input signal INM are input to a first input node and a second input node of an operational amplifier 101, each through an input resistor Rin. A first output terminal $T_{OUTM}$ and a second output terminal $T_{OUTP}$ are coupled, through a first feedback path 106-1 (as well as a feedback resistor Rfb) and a second feedback path 106-2 (as well as a feedback resistor Rfb), to the first input terminal $T_{INP}$ and a second input terminal $T_{INM}$, respectively. The input integrator stage 110 is configured to produce filtered input signals 117-1 and 117-2 at a first output node and a second output node of the operational amplifier 101.

In the example shown in FIG. 1A, the PWM modulator stage 140 is coupled to the input integrator stage 110 and configured to receive the filtered input signals 117-1 and 117-2 from the input integrator stage 110 and to generate PWM signals 143-1 and 143-2.

In the example shown in FIG. 1A, the PWM modulator stage 140 includes, among other components, a first comparator 141, a second comparator 142, and an oscillator 145. The filtered input signals 117-1 and 117-2 are input to a first comparator 141 and a second comparator 142, respectively. Each of the filtered input signals 117-1 and 117-2 is compared with a triangular signal (i.e., a signal having a triangular waveform) VREF generated from the oscillator 145 to generate a first PWM signal 143-1 and a second PWM signal 143-2, respectively. Since the filtered input signals 117-1 and 117-2 are differential signals and the same triangular signal VREF is used as the reference signal, the first PWM signal 143-1 and the second PWM signal 143-2 are differential signals as well (i.e., being the complement of each other).

An output driver stage 150 is coupled to the PWM modulator stage 140 and is configured to receive the PWM signals 143-1 and 143-2 for driving output transistors M1, M2, M3, and M4. In one embodiment, the output transistors M1, M2, M3, and M4 are metal oxide semiconductor field-effect transistors (MOSFETs). It should be understood that other types of transistors may be employed in other embodiments as needed. As a result, output signals OUTM and OUTP are output at the output terminals $T_{OUTM}$ and $T_{OUTP}$, respectively.

In the example shown in FIG. 1A, the p-type output transistor M1 and the n-type output transistor M2 are connected in series between a lower power rail (e.g., Vss or ground) and a higher power rail (e.g., $V_{DD}$); the p-type output transistor M3 and the n-type output transistor M4 are connected in series between a lower power rail (e.g., Vss or ground) and a higher power rail (e.g., $V_{DD}$)). The n-type output transistors M2 and M4 and the p-type output transistors M1 and M3 are characterized by large dimensions (e.g., channel length, channel width, etc.), as compared to other transistors in the class-D amplifier 100, to drive the output load to meet the desired power efficiency.

In one embodiment, the n-type output transistors M2 and M4 are NMOS transistors, and the p-type output transistors M1 and M3 are PMOS transistors. It should be understood that other types of transistors may be employed for the n-type output transistors M2 and M4 and the p-type output transistors M1 and M3. The main function of the output transistors M1 and M3 is to pull up the voltage on the output terminals to the higher supply rail when turned on. Therefore, in general they could be referred to as pull-up transistors. In other embodiments, the output transistors M1 and M3 could also be implemented using NMOS transistors with a boosted gate voltage. One of ordinary skill in the art would recognize many variations, modifications, and alternatives.

The first PWM signal 143-1 is coupled to the gates of output transistors M1 and M2, which are electrically connected together. The first PWM signal 143-1, therefore, controls the turning on and turning off of the output transistors M1 and M2. The second PWM signal 143-2 is coupled to the gates of output transistors M3 and M4, which are electrically connected together. The second PWM signal 143-2, therefore, controls the turning on and turning off the output transistors M3 and M4. As a result, the first output signal OUTM and the second output signal OUTP of the class-D amplifier 100 are differential output signals as well. As shown in FIG. 1A, the first output signal OUTM and the second output signal OUTP are applied to two ends of a speaker load 110, which is represented by an inductor L1 and a resistor R1 in FIG. 1A.

In some embodiments, the subsequent modulator stages 130 are coupled between the differential input integrator 110 and the PWM modulator stage 140. The subsequent modulator stages 130 can be one or more stages, depending on the order of the modulator loop.

The differential input integrator stage 110 receives the input signals INP and INM through the input resistors Rin, and also receives the output signals OUTM and OUTP (in the form of feedback signals) through the feedback resistors Rfb. Since the output signals OUTP and OUTM are switching between power supply voltages Vdd and Vss at a fast switching rate, the fast switching currents through the feedback resistor Rfb will need to be supplied through the outputs of operational amplifier 101 and the integrator capacitors Cint. This is in order to keep the input nodes of the operational amplifier 101 at the same voltage and to keep the output nodes of the operational amplifier 101 close to Vdd/2. Since the operational amplifier 101 is part of the feedback loops 106-1 and 106-2 and the subsequent modulator stages 130 provide finite signal gain, the output signals 117-1 and 117-2 of the operational amplifier 101 remain relatively small and close to the common mode voltage Vdd/2 during operation. The modulator is designed such that the dominant pole of the feedback loops 106-1 and 106-2 is determined by the first integrator stage and such that the time constant $t_c$ is described according to $t_c \approx Rfb \times Cint$.

Additionally, the modulator in-band output noise is determined by the operational amplifier 101, with the feedback resistors Rfb and the input resistors Rin, since the noise from the subsequent modulator stages 130 is suppressed by the feedback loops 106-1 and 106-2 gain. The noise power contribution of Rfb is described according to $4KT \times Rfb$, where k is the Boltzmann constant and T is the temperature. In order to reduce the modulator output noise, the resistance of the feedback resistance Rfb can be reduced. However, in order to keep the same time constant $t_c$, the capacitance of the capacitor Cint will need to be increased. For a lower value of the resistance of the feedback resistance Rfb, the fast current transitions at the output nodes of the operational amplifier 101 will be even larger, requiring a higher amplifier DC bias. This requires larger output devices and therefore will also impact the amplifier Miller capacitance and input stage design, which is highly undesired.

Figure 1B:
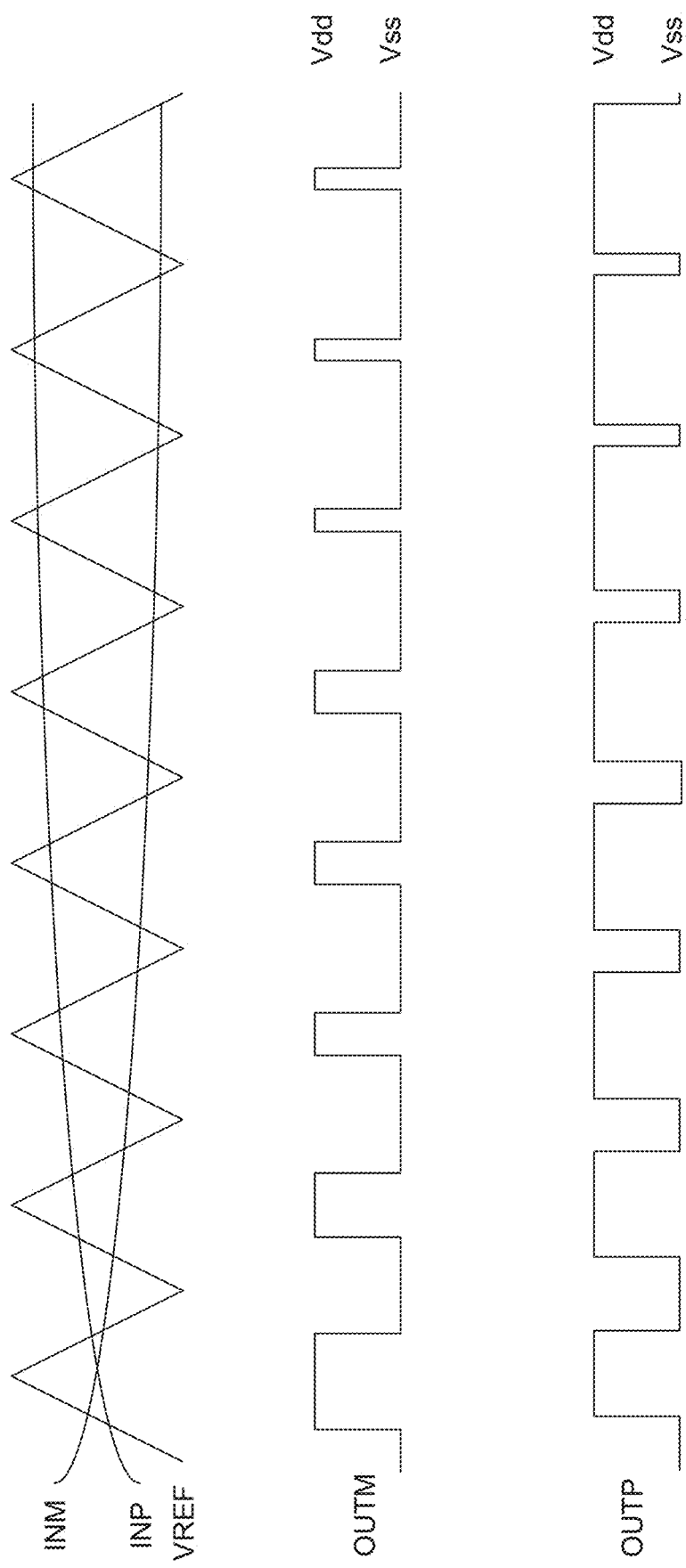
FIG. 1B is a waveform diagram illustrating the modulation of signals in the class-D amplifier 100 of FIG. 1A.

FIG. 1B is a waveform diagram illustrating the modulation of signals in the class-D amplifier 100 of FIG. 1A. As shown in FIG. 1B, the first audio input signal INP and the second audio input signal INM are compared with the triangular signal VREF, as described above in connection with FIG. 1A. The output signals of the first comparator 141 and the second comparator 142 are pulse signals at a fixed frequency (i.e., a fixed cycle) whose pulse width is proportional to its corresponding audio input signal. As a result, the first output signal OUTM and the second output signal OUTP are two PWM signals, as shown in FIG. 1B.

Figure 2:
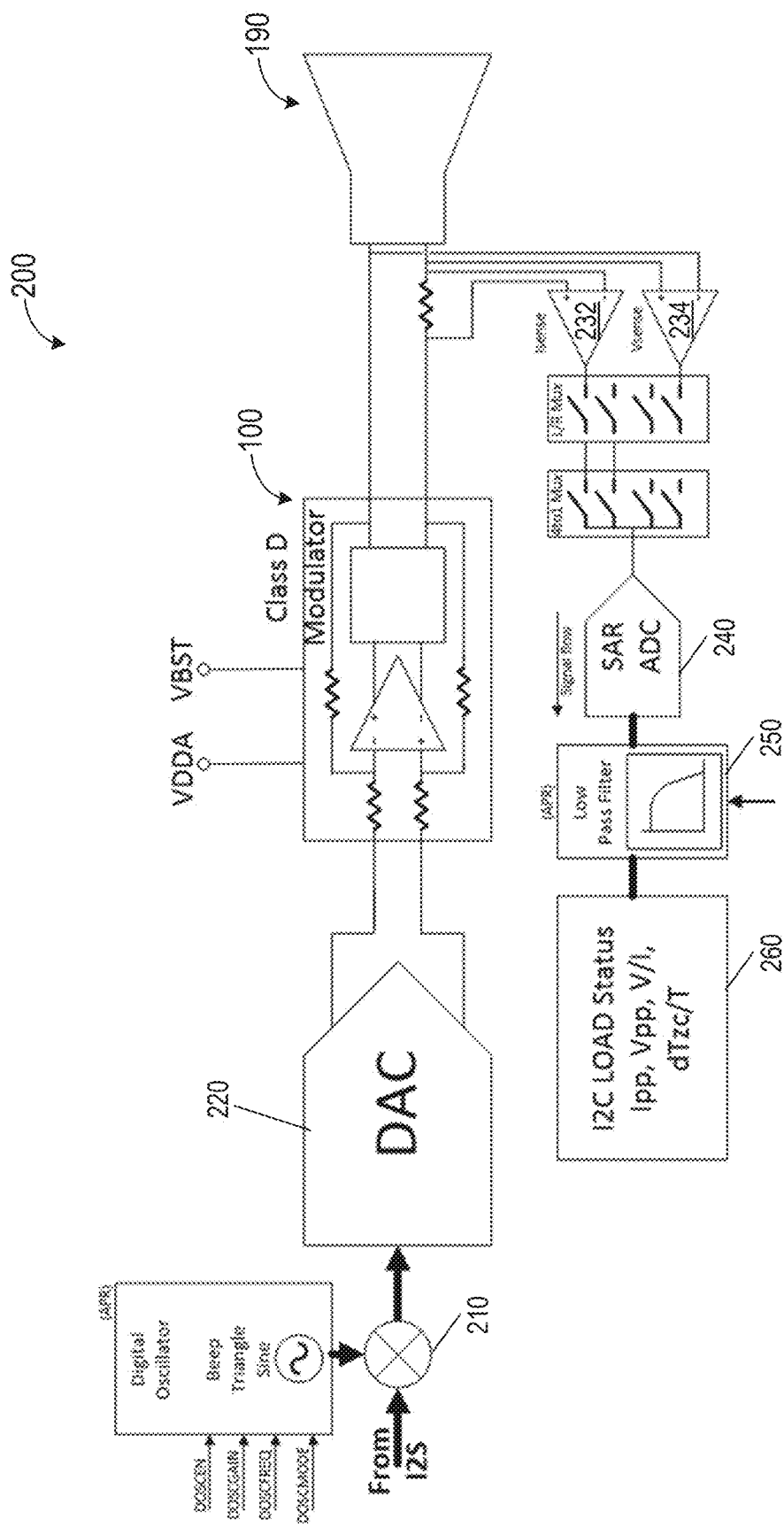
FIG. 2 is a diagram illustrating an example of a configuration for sensing load impedance in accordance with some embodiments.

FIG. 2 is a diagram illustrating an example of a configuration 200 for sensing load impedance in accordance with some embodiments. For diagnostics of the load (e.g., speaker) 190, it is desired to sense the load impedance of L1 and R1. This will allow for determining a faulty speaker at an earlier stage.

A test tone is generated, by a mixer 210 and a DAC 220, and fed towards the class-D amplifier 100 and the load 190. In order to sense the load impedance, the voltage across the load 190 (also referred to as the "sensed voltage" and labeled as "Vsense" in FIG. 2) needs to be sensed as well as the sensed load current (also referred to as the "sensed current" and labeled as "Isense" in FIG. 2). In the example shown in FIG. 2, a current sensing circuit 232 and a voltage sensing circuit 234 are used to sense the sensed current and the sensed voltage, respectively.

The sensed current and the sensed voltage are then fed into an Analog to Digital Converter (ADC) 240. In the example shown in FIG. 2, the ADC 240 is a successive-approximation-register (SAR) ADC. In another example, the ADC 240 is a Sigma-Delta DAC. After passing a low pass filter 250, the digitalized signals (Isense and Vsense) are fed to a digital processor 260, which is configured to calculate the impedance of the load 190 based on the sensed current Isense and the sensed voltage Vsense. It should be understood the configuration shown in FIG. 2 is exemplary rather than limiting, and other configurations may be employed in other embodiments.

Figure 3:
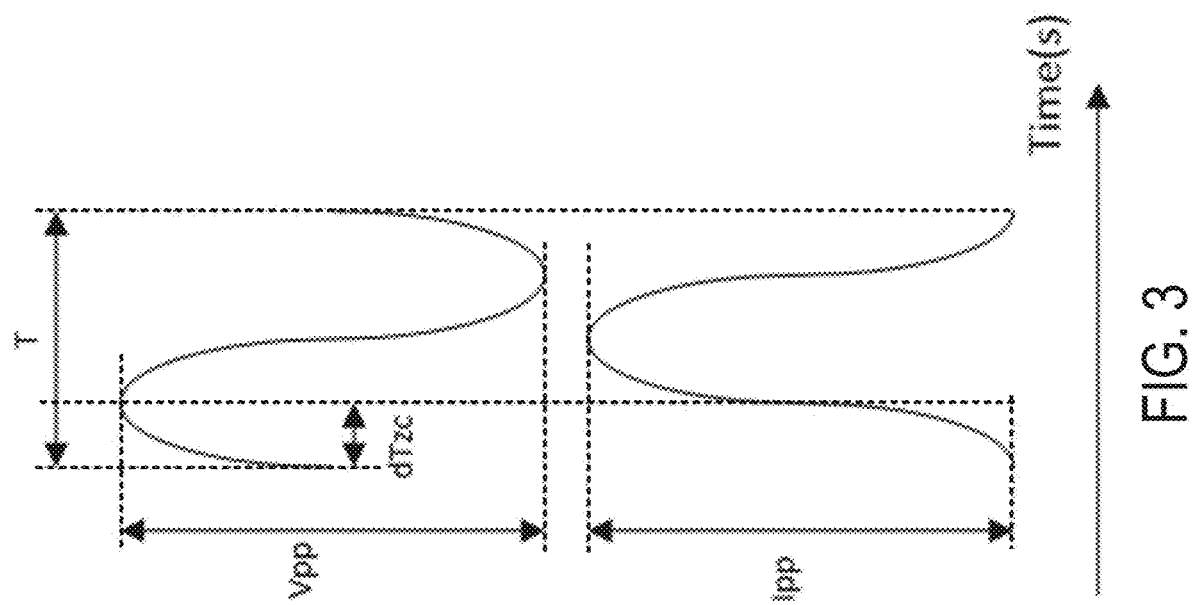
FIG. 3 is a diagram illustrating the sensed voltage and the sensed current in accordance with some embodiments.

FIG. 3 is a diagram illustrating the sensed voltage and the sensed current. In should be understood that FIG. 3 illustrates just one of various possible examples and is not intended to be limiting. As shown in FIG. 3, the sensed voltage and the sensed current both have a sine waveform, with a 90-degree phase shift there between. When the sensed current is at its peak, the sensed voltage is zero. When the sensed voltage is at its peak, the sensed current is zero.

Some techniques have been developed for switched driver current sensing, but they all have drawbacks. In one example, a sense resistor is inserted at the output in series with the load, and the voltage across the sense resistor is amplified before providing the signal to the ADC. However, the disadvantage of such solution is that large common mode swings have to be rejected for ternary modulated schemes and that a large DC common mode level has to be rejected, while only a small differential signal is present.

In another example, sense resistors are placed in series with the NMOS transistors of the driver stage. The load current is sensed by amplifying the differential voltages across the resistors. This technique relies on the fact that the BDM modulated signal high time ($T_{high}$) and low time ($T_{low}$) are the same in theory, allowing to sense only the lower side (i.e., the side connected to the lower power rail like Vss). Details of the high time ($T_{high}$) and low time ($T_{low}$) will be described below withe reference to FIG. 4.

In yet another example, the sense resistors are sensed through charge accumulation. However, the problem with this technique is that it becomes timing sensitive. In addition, this technique relies on a purely inductive load, which is not always the case. Parasitic capacitances on the load will distort the sensed current.

Also, a common disadvantage of these techniques for current sensing using the sense resistors is that the sense resistors dissipate power, which reduces the driver power efficiency. In order to get a larger output signal, a larger resistor is required, which dissipates more power. Also, since the resistance of the sense resistor is relatively small (e.g., about 0.02 to 0.1 Ohm), the sense resistor carries a relatively large currents (e.g., larger than 1 A). The sense resistor is typically made from top metal layer routing resources, bond wires, or redistribution layers (RDL), for which the electrical characteristics are often not well modeled, and the process and temperature spread is not well known. This requires additional circuitry to trim the final value and temperature trim.

Therefore, it is desirable to eliminate the sense resistors from the sensing circuit and use an alternative technique to sense the load current.

Figures 4A, 4B:
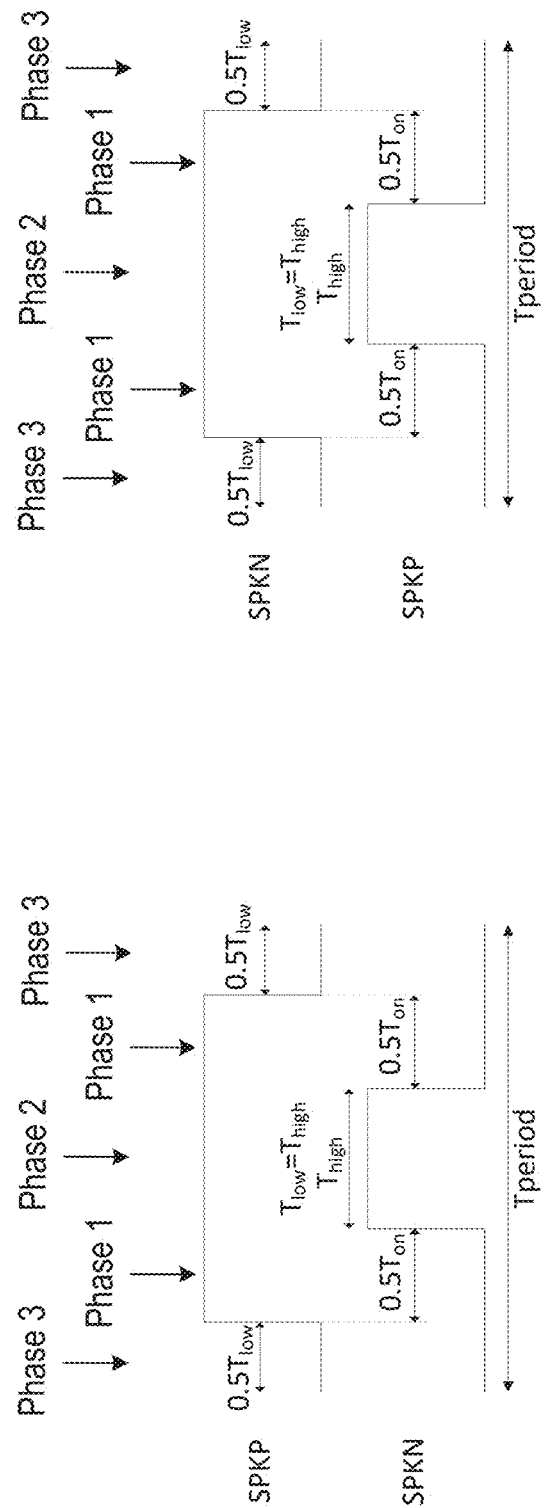
FIG. 4A is a diagram illustrating four phases of operation of a class-D amplifier when providing an average positive output voltage to the load in accordance with some embodiments.
FIG. 4B is a diagram illustrating three phases of operation of a class-D amplifier when providing an average negative output voltage to the load in accordance with some embodiments.

FIG. 4A is a diagram illustrating three phases of operation of a class-D amplifier when providing an average positive output voltage to the load. The positive (speaker) output signal (labeled as "SPKP") and the negative (speaker) output signal (labeled as "SPKN") are shown. In phase 1, the SPKP signal is at logic high, while the SPKN signal is at logic low. In phase 2, the SPKP signal is at logic high, while the SPKN signal is at logic high. In phase 3, the SPKP signal is at logic low, while the SPKN signal is at logic low.

FIG. 4B is a diagram illustrating three phases of operation of a class-D amplifier when providing an average negative output voltage to the load. The positive (speaker) output signal (labeled as "SPKP") and the negative (speaker) output signal (labeled as "SPKN") are shown. In phase 1, the SPKP signal is at logic low, while the SPKN signal is at logic high. In phase 2, the SPKP signal is at logic high, while the SPKN signal is at logic high. In phase 3, the SPKP signal is at logic low, while the SPKN signal is at logic low.

Figure 5:
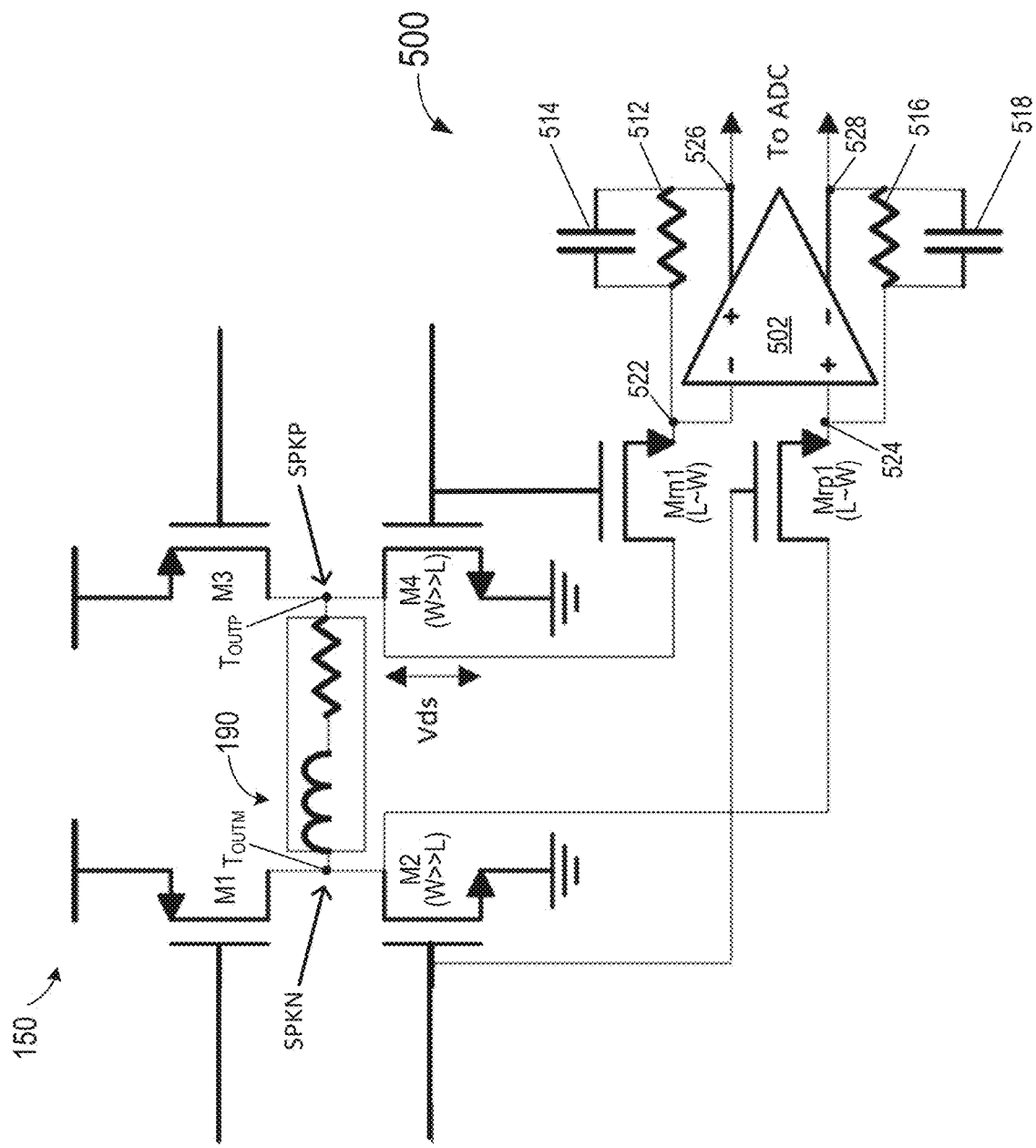
FIG. 5 is a diagram illustrating a current sensing circuit 500 used for a class-D amplifier in accordance with some embodiments.

FIG. 5 is a diagram illustrating a current sensing circuit 500 used for a class-D amplifier in accordance with some embodiments. In the example shown in FIG. 5, the current sensing circuit 500 is connected to the output driver stage 150 of the class-D amplifier 100 shown in FIG. 1A.

As discussed above, the output driver stage 150 includes p-type output transistors M1 and M3 and n-type output transistors M2 and M4, connected in the manner shown in FIG. 5. Specifically, the source of M1 is connected to a higher power rail (e.g., $V_{DD}$), the drain of M1 is connected to the drain of M2 at the first output terminal $T_{OUTM}$, and the source of M2 is connected to a lower power rail (e.g., $V_{SS}$ or ground). The source of M3 is connected to a higher power rail (e.g., $V_{DD}$), the drain of M3 is connected to the drain of M4 at the second output terminal $T_{OUTP}$, and the source of M4 is connected to a lower power rail (e.g., $V_{SS}$ or ground). The load 190 is connected between the first output terminal TOUT and the second output terminal $T_{OUTP}$.

The current sensing circuit 500 includes, among other components, a positive input replica transistor Mrp1, a negative input replica transistor Mrn1, an operational amplifier 502, a first feedback resistor 512, a first feedback capacitor 514, a second feedback resistor 516, and a second feedback capacitor 518. The operational amplifier 502 includes a positive input terminal 524, a negative input terminal 522, a positive output terminal 526, and a negative output terminal 528.

The gate of the positive input replica transistor Mrp1 is connected to the gate of M2, the drain of the positive input replica transistor Mrp1 is connected to the drain of M2, and the source of the positive input replica transistor Mrp1 is connected to the positive input terminal of the operational amplifier 502. The gate of the negative input replica transistor Mrn1 is connected to the gate of M4, the drain of the negative input replica transistor Mrn1 is connected to the drain of M4, and the source of the negative input replica transistor Mrn1 is connected to the negative input terminal of the operational amplifier 502.

The first feedback resistor 512 and the first feedback capacitor 514 are connected in parallel between the negative input terminal 522 and the positive output terminal 526. The second feedback resistor 516 and the second feedback capacitor 518 are connected in parallel between the positive input terminal 524 and the negative output terminal 528. The positive output terminal 526 and the negative output terminal 528 of the operational amplifier 502 are connected to an ADC (e.g., the ADC 240 shown in FIG. 2) for signal processing.

The invention described here makes use of the fact that the n-type output transistors M2 and M4 typically have a limited on resistance $R_{DS,ON}$, which is typically larger compared to the sense resistors used in previous techniques discussed above. The on resistance $R_{DS,ON}$ is approximated according to the following equation:

$$R_{DS,ON} \approx \frac{1}{\mu \cdot C_{OX} \cdot \frac{W}{L} \cdot (V_{GS} - V_{TH})}.$$

As shown in the equation, the carrier mobility u varies strongly as temperature varies. Also, the oxide thickness Cox and threshold voltage VTH vary strongly with the process corner, a variation of fabrication parameters used in applying an IC design to a semiconductor wafer. Therefore, the value of $R_{DS,ON}$ is strongly temperature and process dependent.

Therefore, in order to obtain a sensed load current signal, two much smaller replica transistors, namely the positive input replica transistor Mrp1 and the negative input replica transistor Mrn1, are used as part of the gain stage.

The positive input replica transistor Mrp1 and the negative input replica transistor Mrn1 are fabricated at the same process corner as the n-type output transistors M2 and M4. The temperature difference between the positive input replica transistor Mrp1 and the negative input replica transistor Mrn1 and the n-type output transistors M2 and M4 is almost zero. The difference between the positive input replica transistor Mrp1 and the negative input replica transistor Mrn1 and the n-type output transistors M2 and M4 lies in the dimensional parameters W/L, as will be discussed below.

FIGS. 6-9 are diagrams illustrating the current sensing circuit 500 under different phases in accordance with some embodiments. In a first phase (e.g., Phase 1 shown in FIG. 4A) shown in FIG. 6, the higher power rail is supplied with VBST, which is the maximum output voltage of the class-D amplifier 100 shown in FIG. 1A. In one example, the VBST level is about 12 V. It should be understood that this example is not intended to be limiting. The voltage supplied to the gate of M1 is VBST, the voltage supplied to the gate of M3 is VBST minus 5 V, the voltage supplied to the gate of M2 is 5 V, and the voltage supplied to the gate of M4 is 0 V. The voltage supplied to the gate of the positive input replica transistor Mrp1 is also 5 V. The voltage supplied to the gate of the negative input replica transistor Mrn1 is also 0 V.

As a result, the p-type output transistor M1 is turned off, the p-type output transistor M1 is turned on, the n-type output transistor M2 is turned on, and the n-type output transistor M4 is turned off. Therefore, a current flows from M3 to M2, through the load 190, as shown in the dashed arrow in FIG. 6. In addition, the positive input replica transistor Mrp1 is turned on, and the negative input replica transistor Mrn1 is turned off.

The current develops a voltage $V_{DS}$ across M2, and the voltage $V_{DS}$ can be expressed according to the following equation: $V_{DS}=1_{load} \times R_{DS,ON}$. Because the positive input replica transistor Mrp1 is turned on and the operational amplifier 502 input voltage at the input terminal 524 is kept close to 0V, the drain to source voltage across the positive input replica transistor Mrp1 is equal to $V_{DS}=I_{load1a} \times R_{DS,ON}$.

Since the voltage gain of the operational amplifier 502 is proportional to $R_{fb}/R_{rDS,ON}$, where Rfb is the resistance of the first feedback resistor 512, and $R_{rDS,ON}$ is the (drain to source) on resistance of the positive input replica transistor Mrp1. Therefore, the output voltage can be expressed according to the following equation: $Vout=I_{load1a} \times R_{DS,ON} \times (R_{fb}/R_{rDS,ON})$.

Because the ratio of $R_{DS,ON}$ to $R_{rDS,ON}$ is approximated according to the following equation:

$$\left(\frac{R_{DS,ON}}{R_{rDS,ON}}\right) \approx \frac{\mu \cdot C_{OX} \cdot \frac{Wr}{Lr} \cdot (V_{GSr} - V_{TH})}{\mu \cdot C_{OX} \cdot \frac{W}{L} \cdot (V_{GS} - V_{TH})}.$$

The positive input replica transistor Mrp1 is biased with the same gate to source voltage (i.e., $V_{GS}$) as M2, the positive input replica transistor Mrp1 and M2 are fabricated at the same process corner, all parameters are the same in the equation above except for the W/L ratio. Therefore, the equation above can be simplified as:

$$\left(\frac{R_{DS,ON}}{R_{rDS,ON}}\right) \approx \frac{\frac{Wr}{Lr} \cdot (V_{GS} - V_{TH})}{\frac{W}{L} \cdot (V_{GS} - V_{TH})} \approx c.$$

The constant c is purely defined by the dimensions of M2 and the positive input replica transistor Mrp1, which can be made very accurate in a sub-micron process. As an example, the W/L ratio for M2 is 100 (W>>L), and the W/L ratio for the positive input replica transistor Mrp1 is 1 (L~W), then the constant c is about 0.01.

Figure 6:
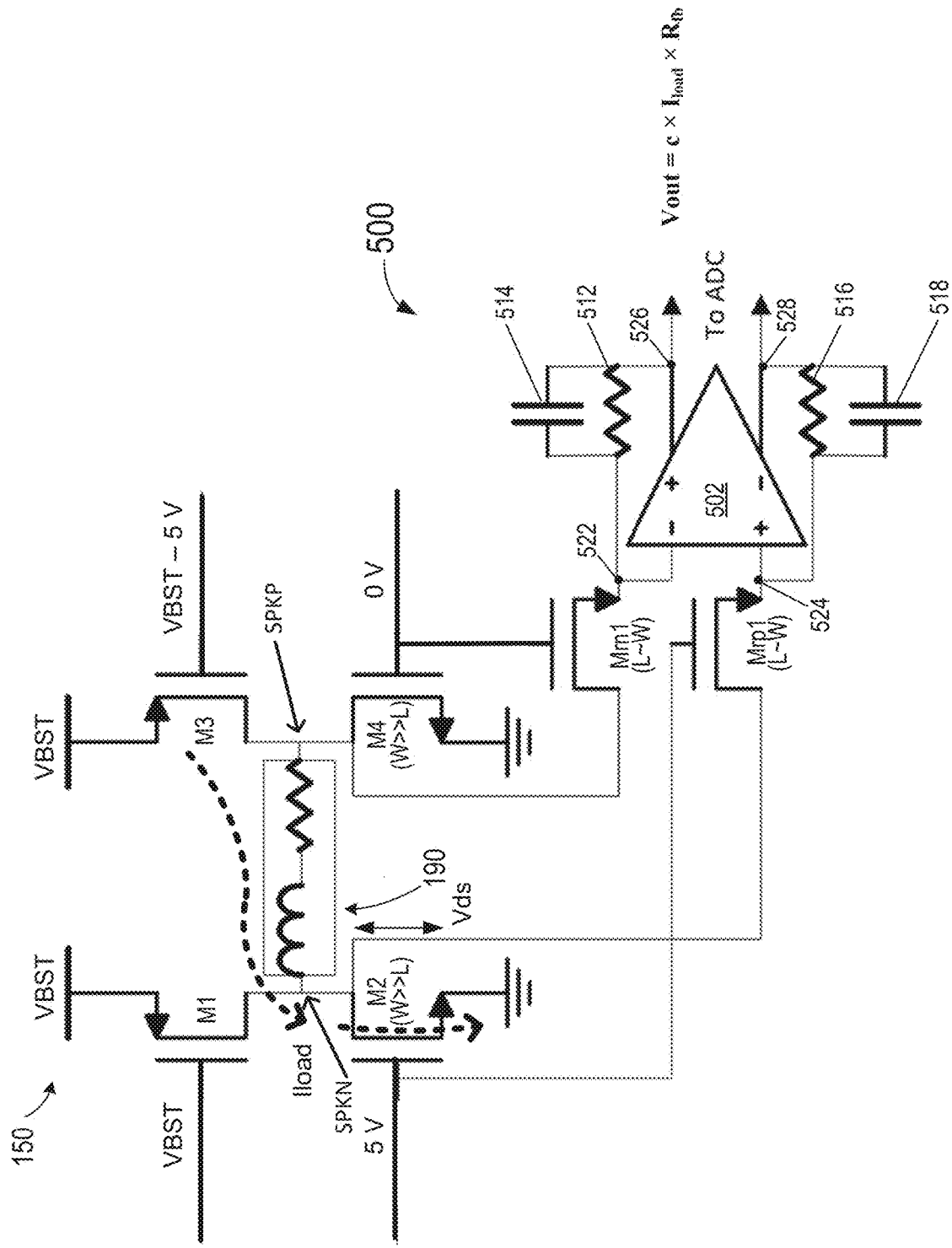
FIGS. 6-9 are diagrams illustrating the current sensing circuit of FIG. 5 under different phases in accordance with some embodiments.

Therefore, the output voltage can be expressed according to: $Vout=c \times I_{load1a} \times R_{fb}$, as shown in FIG. 6.

Figure 7:
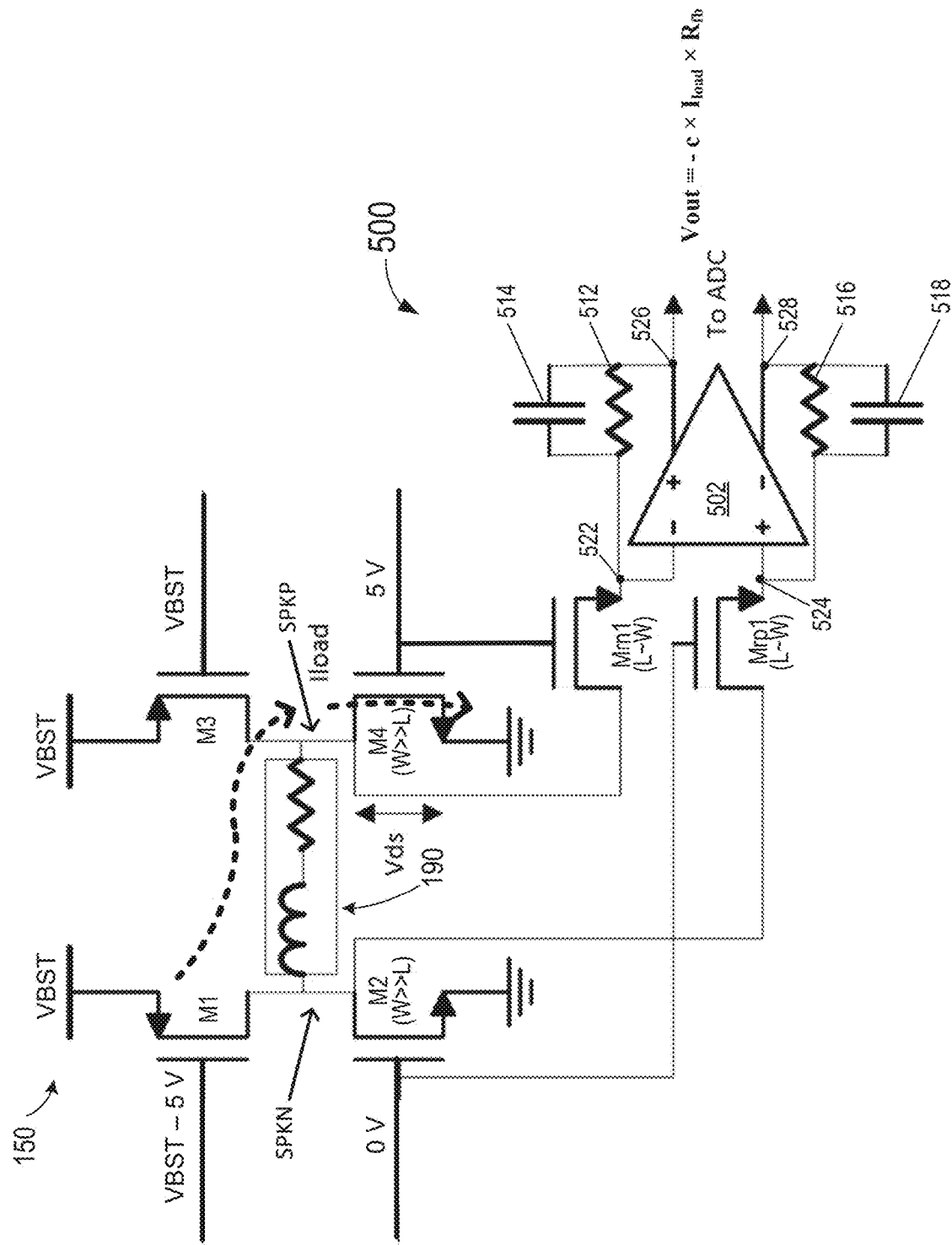

Alternatively, in another phase (Phase 1 shown in FIG. 4B) shown in FIG. 7, the higher power rail is supplied with VBST. The voltage supplied to the gate of M3 is VBST, the voltage supplied to the gate of M1 is VBST minus 5 V, the voltage supplied to the gate of M4 is 5 V, and the voltage supplied to the gate of M2 is 0 V. The voltage supplied to the gate of the positive input replica transistor Mrp1 is also 0 V. The voltage supplied to the gate of the negative input replica transistor Mrn1 is also 5 V.

As a result, the p-type output transistor M1 is turned on, the p-type output transistor M3 is turned off, the n-type output transistor M2 is turned off, and the n-type output transistor M4 is turned on. Therefore, a current flows from M1 to M4, through the load 190, as shown in the dashed arrow in FIG. 7. In addition, the positive input replica transistor Mrp1 is turned off, and the negative input replica transistor Mrn1 is turned on.

The current develops a voltage $V_{DS}$ across M4, and the voltage $V_{DS}$ can be expressed according to the following equation: $V_{DS}=I_{load1b} \times R_{DS,ON}$. Because the negative input replica transistor Mrn1 is turned on, and the operational amplifier 502 input voltage at the input terminal 522 is kept close to 0V, the drain to source voltage across the negative input replica transistor Mrn1 is equal to $V_{DS}=I_{load1b} \times R_{DS,ON}$.

Since the voltage gain of the operational amplifier 502 is proportional to $R_{fb}/R_{rDS,ON}$, where Rob is the resistance of the second feedback resistor 518, and $R_{rDS,ON}$ is the (drain to source) on resistance of the negative input replica transistor Mrn1. Therefore, the output voltage can be expressed according to the following equation: $Vout=-I_{load1b} \times R_{DS,ON} \times (R_{fb}/R_{rDS,ON})$.

Because the ratio of $R_{DS,ON}$ to $R_{rDS,ON}$ is approximated according to the following equation:

$$\left(\frac{R_{DS,ON}}{R_{rDS,ON}}\right) \approx \frac{\mu \cdot C_{OX} \cdot \frac{Wr}{Lr} \cdot (V_{GSr} - V_{TH})}{\mu \cdot C_{OX} \cdot \frac{W}{L} \cdot (V_{GS} - V_{TH})}.$$

The negative input replica transistor Mrn1 is biased with the same gate to source voltage (i.e., Vas) as M4, the negative input replica transistor Mrn1 and M4 are fabricated at the same process corner, all parameters are the same in the equation above except for the W/L ratio. Therefore, the equation above can be simplified as:

$$\left(\frac{R_{DS,ON}}{R_{rDS,ON}}\right) \approx \frac{\frac{Wr}{Lr} \cdot (V_{GS} - V_{TH})}{\frac{W}{L} \cdot (V_{GS} - V_{TH})} \approx c.$$

The constant c is purely defined by the dimensions of M4 and the negative input replica transistor Mrn1, which can be made very accurate in a sub-micron process. Therefore, the output voltage can be expressed according to: $Vout=-c \times I_{load1b} \times R_{fb}$, as shown in FIG. 7.

Although FIG. 7 illustrates only one phase (Phase 1) shown in FIG. 4B, a person of ordinary skill in the art would recognize that the same analysis could be applied to the other two phases (i.e., Phase 2 and Phase 3) shown in FIG. 4B.

Figure 8:
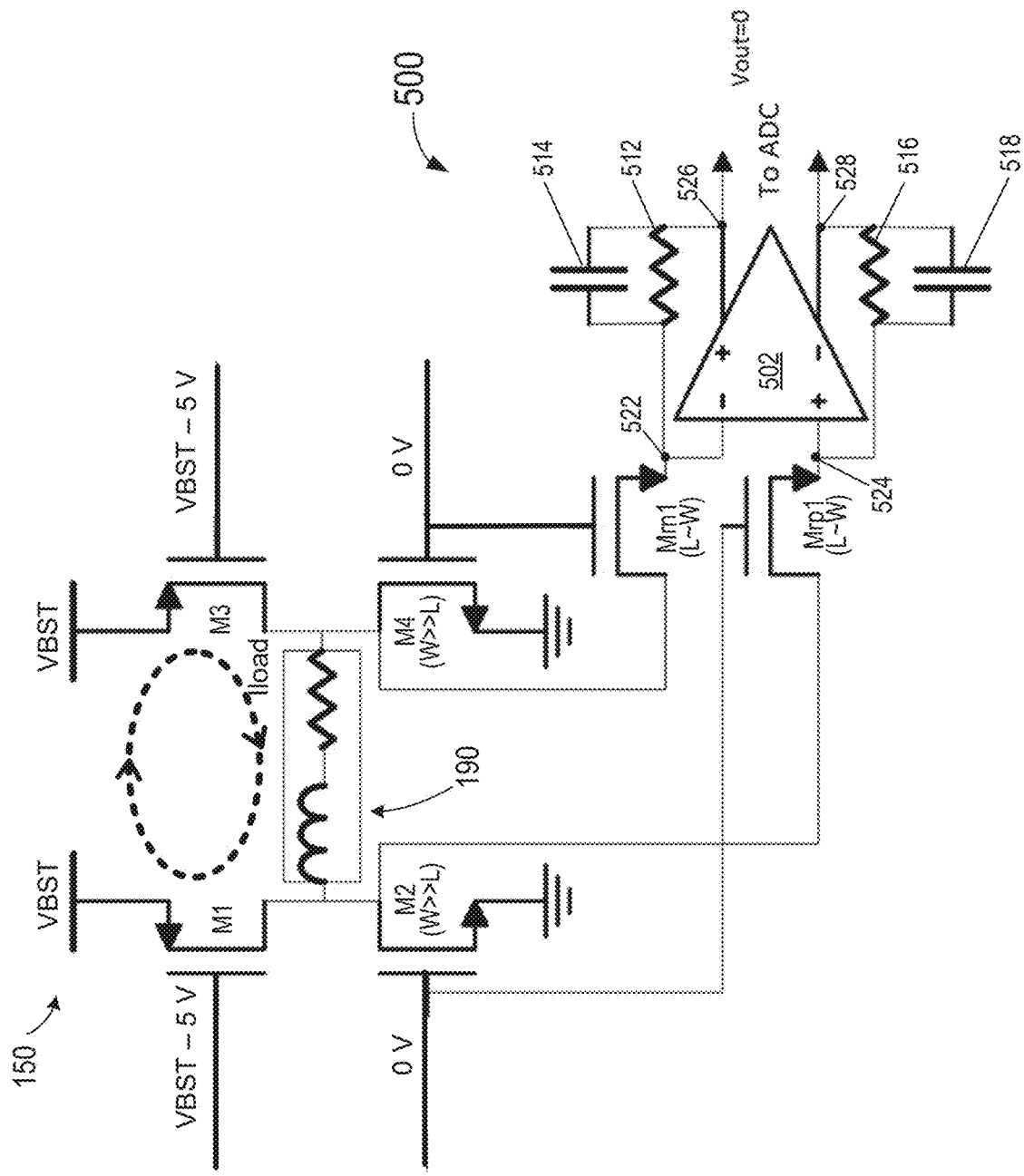

In a second phase (Phase 2 shown in FIG. 4A) shown in FIG. 8, the higher power rail is supplied with VBST. The voltage supplied to the gate of M1 is VBST minus 5 V, the voltage supplied to the gate of M3 is VBST minus 5 V, the voltage supplied to the gate of M2 is 0 V, and the voltage supplied to the gate of M4 is 0 V. The voltage supplied to the gate of the positive input replica transistor Mrp1 is also 0 V. The voltage supplied to the gate of the negative input replica transistor Mrn1 is also 0 V.

As a result, the p-type output transistor M1 is turned on, the p-type output transistor M3 is turned on, the n-type output transistor M2 is turned off, and the n-type output transistor M4 is turned off. Therefore, a current flows from M1 to M3, through the load 190, as shown in the dashed arrow in FIG. 7. In addition, the positive input replica transistor Mrp1 is turned off, and the negative input replica transistor Mrn1 is turned off. As a result, the output voltage is zero, as shown in FIG. 8.

Figure 9:
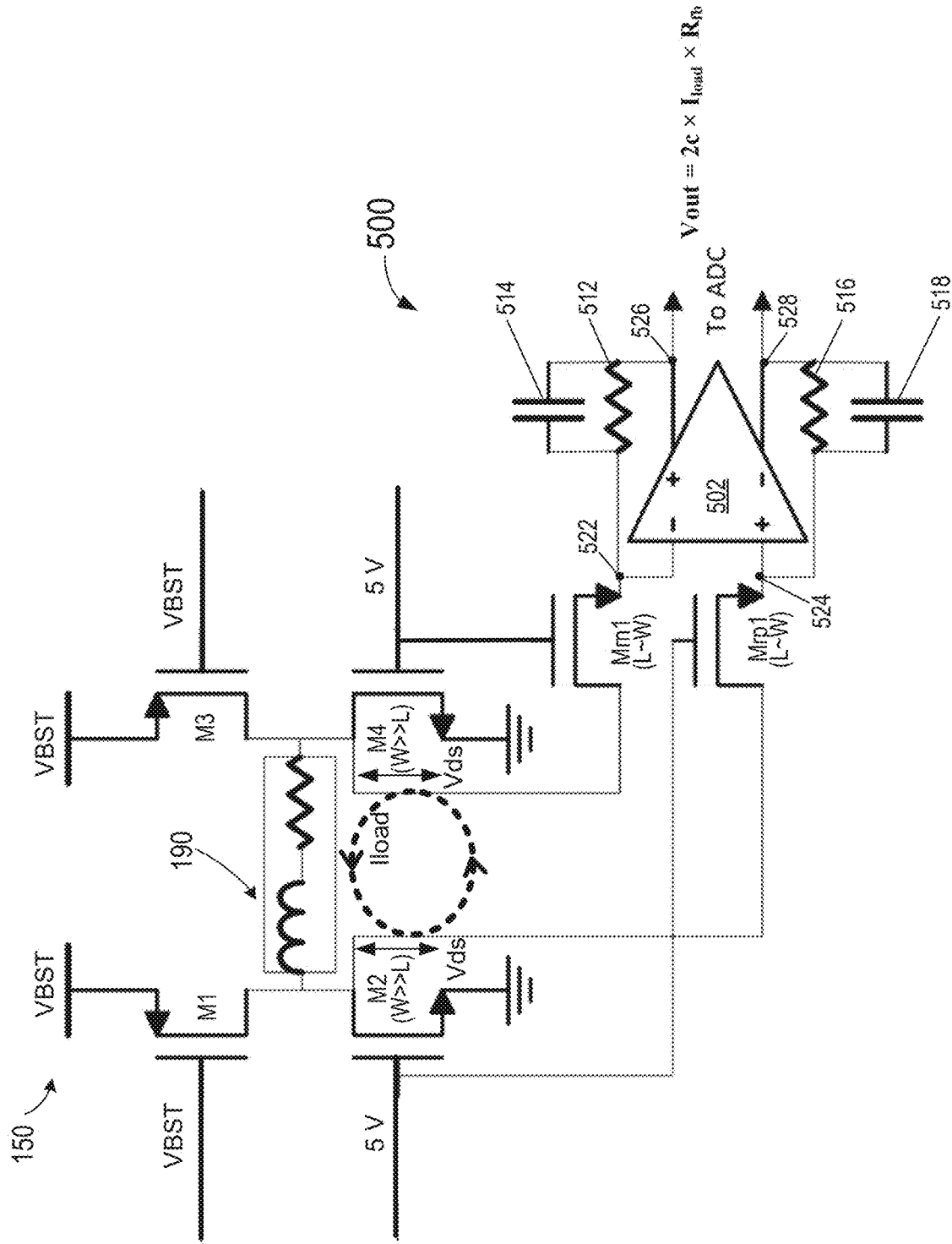

In a third phase (e.g., Phase 3 shown in FIG. 4A) shown in FIG. 9, the higher power rail is supplied with VBST. The voltage supplied to the gate of M1 is VBST, the voltage supplied to the gate of M3 is VBST, the voltage supplied to the gate of M2 is 5 V, and the voltage supplied to the gate of M4 is 5 V. The voltage supplied to the gate of the positive input replica transistor Mrp1 is also 5 V. The voltage supplied to the gate of the negative input replica transistor Mrn1 is also 5 V.

As a result, the p-type output transistor M1 is turned off, the p-type output transistor M3 is turned off, the n-type output transistor M2 is turned on, and the n-type output transistor M4 is turned on. Therefore, a current flows from M2 to M4, through the load 190, as shown in the dashed arrow in FIG. 9. In addition, the positive input replica transistor Mrp1 is turned on, and the negative input replica transistor Mrn1 is turned on.

The current develops a voltage $V_{DS}$ across both M2 and M4, and the voltage $V_{DS}$ can be expressed according to the following equation: $V_{DS}=I_{load3a} \times R_{DS,ON}$. Because both the positive input replica transistor Mrp1 and the negative input replica transistor Mrn1 are turned on and the operational amplifier 502 input voltages at the input terminals 522 and 524 are kept close to 0V, the drain to source voltage across the negative input replica transistor Mrn1 is equal to $V_{DS}=-I_{load3a} \times R_{DS,ON}$. And the drain to source voltage across the positive input replica transistor Mrp1 is equal to $V_{DS}=I_{load3a} \times R_{DS,ON}$.

Using the same analysis as those conducted with reference to FIGS. 6 and 7, the output voltage can be expressed according to: Vout=$2c \times I_{load3a} \times R_{fb}$, as shown in FIG. 9.

Then, the average output voltage of the current sensing circuit can be calculated by calculating the weighted average of the output voltage at these four phases using the period of each phase as the corresponding weight. The average output voltage can be expressed according to the following equation: $V_{average}=(0 \times T_{high}+2c \times I_{load3a} \times R_{fb} \times T_{low}+C \times I_{load1a} \times R_{fb} \times T_{on})/T_{period}=C \times R_{fb} \times (2 \times I_{load3a} \times T_{low}+I_{load1a} \times T_{on})/T_{period}=C \times R_{fb} \times I_{load,average}$. The period $T_{period}$ is equal to the sum of $T_{high}$, $T_{low}$, and $T_{on}$. Therefore, the average current can be calculated by dividing the average output voltage of the current sensing circuit by $c \times R_{fb}$. The averaging of the output current contributions of the various phases to the operational amplifier 502 output voltage is performed by the first and second feedback capacitors 514 and 518. Together with the first and second feedback resistors 512 and 516 they provide a low pass response, such that the operational amplifier 502 output voltage output signal mainly contains the load current signals in the frequency band of interest with attenuated out of band voltage output near the Class-D amplifier switching frequency.

Although $V_{average}$ has been calculated based on FIGS. 4A, 6, 8, and 9, a person of ordinary skill in the art would recognize that the same methodology could be applied to FIG. 4B.

As explained above with reference to FIGS. 5-9, the current sensing circuit 500 has the following advantages. First, no sense resistor is required. As a result, a higher power efficiency can be achieved. Second, since the operational amplifier 502, the positive input replica transistor Mrp1, and the negative input replica transistor Mrn1 are used instead of a sense resistor, a temperature-independent and process-corner-independent gain is achieved.

Figure 10:
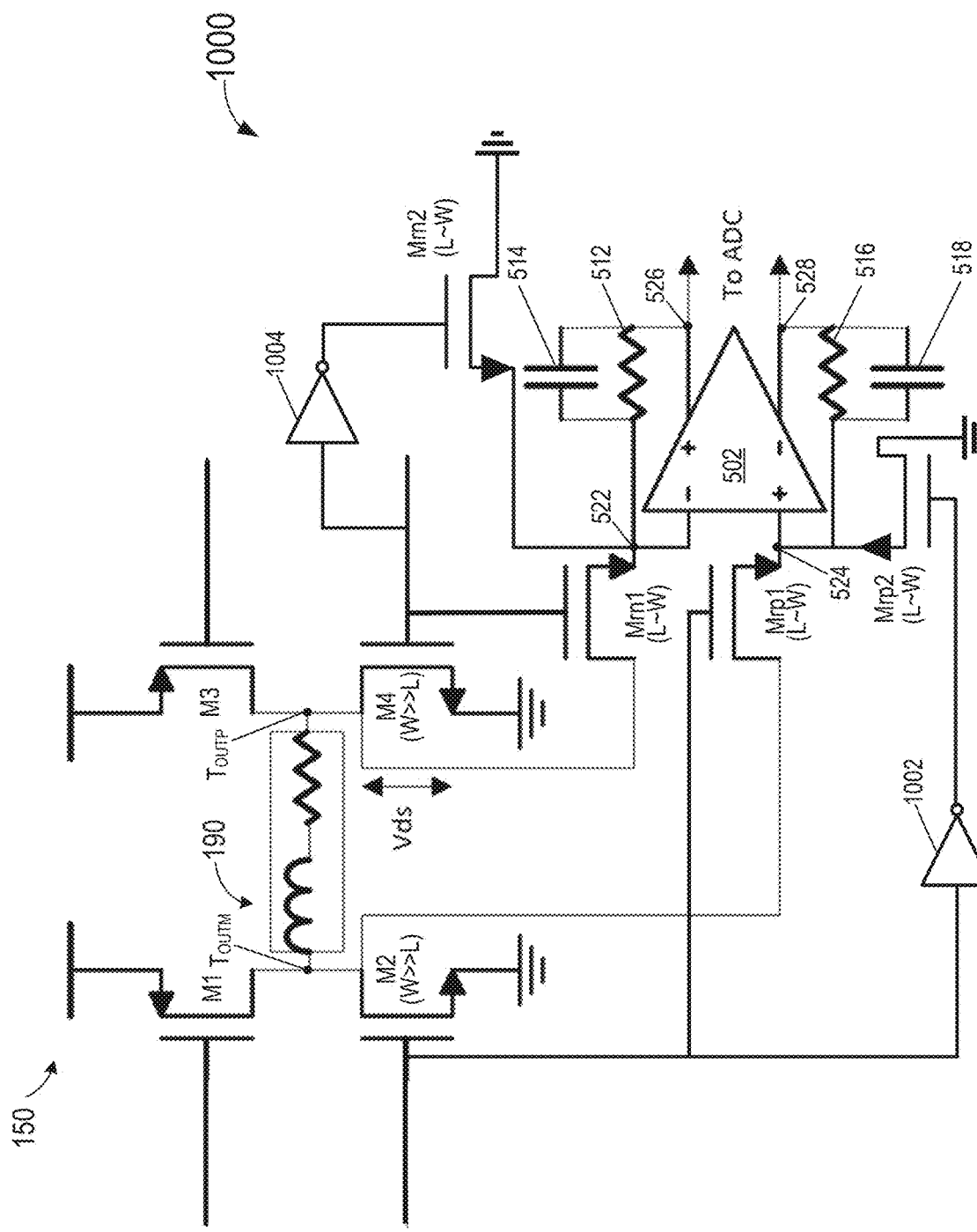
FIG. 10 is a diagram illustrating a current sensing circuit used for a class-D amplifier in accordance with some embodiments.

FIG. 10 is a diagram illustrating a current sensing circuit 1000 used for a class-D amplifier in accordance with some embodiments. The current sensing circuit 1000 is similar to and shares the same primary operation principles with the current sensing circuit 500 shown in FIG. 5. The difference between the current sensing circuit 1000 and the current sensing circuit 500 is that the current sensing circuit 1000 further includes a positive secondary replica transistor Mrp2, a negative secondary replica transistor Mrn2, a first inverter 1002, and a second inverter 1004. Other similar or identical components, such as M1, M2, M3, and M4, are not repeated for conciseness.

The source of the positive secondary replica transistor Mrp2 is connected to the source of the positive input replica transistor Mrp1 at the positive input terminal 524 of the operational amplifier 502. The drain of the positive secondary replica transistor Mrp2 is connected to ground. The gate of the positive secondary replica transistor Mrp2 is connected to the first inverter 1002, which is connected to the gate of the positive input replica transistor Mrp1. As a result, when the positive input replica transistor Mrp1 is turned on, the positive secondary replica transistor Mrp2 is turned off; when the positive input replica transistor Mrp1 is turned off, the positive secondary replica transistor Mrp2 is turned on. Since at least one of the positive input replica transistor Mrp1 and the positive secondary replica transistor Mrp2 are turned on, the voltage level at the positive input terminal 524 is kept near $V_{SS}$ (ground in this example). Since a large voltage swing at the positive input terminal 524 results in large signal distortion, the introduction of the positive secondary replica transistor Mrp2 reduces the signal distortion. The addition of the positive and negative secondary replica transistors Mrp2 and Mrn2 together with the first and second inverters 1002 and 1004 keeps the positive and negative input terminals 524 and 522 of the operational amplifier 502 near Vss. This allows for the drain to source voltages of the positive input replica transistor Mrp1 and the negative input replica transistor Mrn1 to follow the drain to source voltages of the n-type output transistors M2 and M4 closely, as discussed above in reference to FIGS. 6-9.

The dimension of the positive secondary replica transistor Mrp2 is chosen to be the same as that of the positive input replica transistor Mrp1. In one example, the W/L ratio is about one. Also, since the positive secondary replica transistor Mrp2 is connected to ground, it does not provide additional voltage change when it is turned on (i.e., when the positive input replica transistor Mrp1 is turned off). This will keep the voltage level at the positive input terminal 524 at the same level as when the positive input replica transistor Mrp1 is turned on and maintains the gain ratio with the feedback resistor 516/512. This allows the voltage level at the positive input terminal 524 to remain relatively constant, and the amplifier design can be cased.

Likewise, the source of the negative secondary replica transistor Mrn2 is connected to the source of the negative input replica transistor Mrn1 at the negative input terminal 522 of the operational amplifier 502. The drain of the negative secondary replica transistor Mrn2 is connected to ground. The gate of the negative secondary replica transistor Mrn2 is connected to the second inverter 1004, which is connected to the gate of the negative input replica transistor Mrn1. As a result, when the negative input replica transistor Mrn1 is turned on, the negative secondary replica transistor Mrn2 is turned off; when the negative input replica transistor Mrn1 is turned off, the negative secondary replica transistor Mrn2 is turned on. Since at least one of the negative input replica transistor Mrn1 and the negative secondary replica transistor Mrn2 are turned on, the voltage level at the negative input terminal 522 is kept near $V_{SS}$ (ground in this example). Since a large voltage swing at the negative input terminal 522 results in large signal distortion, the introduction of the negative secondary replica transistor Mrn2 reduces the signal distortion.

The dimension of the negative secondary replica transistor Mrn2 is chosen to be the same as that of the negative input replica transistor Mrn1. In one example, the W/L ratio is about one. Also, since the negative secondary replica transistor Mrn2 is connected to ground, it does not provide additional voltage change when it is turned on (i.e., when the negative input replica transistor Mrn1 is turned off). This will keep the voltage level at the negative input terminal 522 at the same level as when the negative input replica transistor Mrn1 is turned on and maintains the gain ratio with the feedback resistor 516/512. This allows the voltage level at the negative input terminal 522 to remain relatively constant, and the amplifier design can be eased.

In summary, the positive input terminal 524 and the negative input terminal 522 are biased at the same voltage level as the lower power rail Vss (e.g., ground). The first n-type output transistor M2 is always gated on when the first pull-up output transistor M1 is gated off, while the first n-type output transistor M2 is always gated off when the first pull-up output transistor is gated on. The second n-type output transistor M4 is always gated on when the second pull-up output transistor M3 is gated off, while the second n-type output transistor M4 is always gated off when the second pull-up output transistor M3 is gated on. The positive output terminal 526 and the negative output terminal 528 of the operational amplifier 502 provide a voltage output linearly proportional to the average load current of the class_D amplifier.

Figure 11:
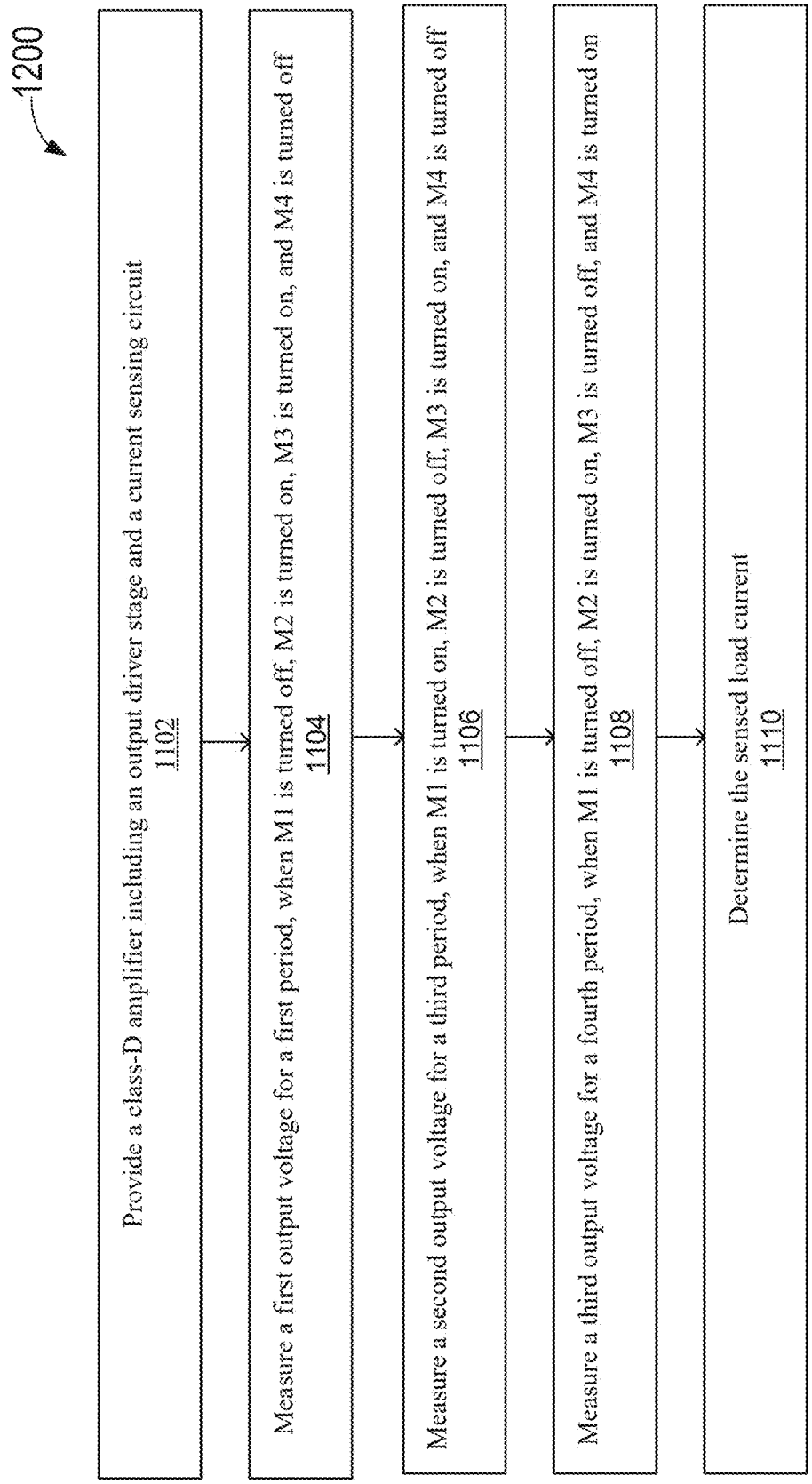
FIG. 11 is a flowchart diagram illustrating an example method for sensing load current of a class-D amplifier in accordance with some embodiments.

FIG. 11 is a flowchart diagram illustrating an example method for sensing load current of a class-D amplifier in accordance with some embodiments. In the example shown in FIG. 11, the method 1100 includes operations (or steps) 1102, 1104, 1106, 1108, and 1110. Additional operations may be performed. Also, it should be understood that the sequence of the various operations discussed above with reference to FIG. 11 is provided for illustrative purposes, and as such, other embodiments may utilize different sequences. For instance, steps 1104, 1106, and 1108 may be performed in other orders different from that shown in FIG. 11. These various sequences of operations are to be included within the scope of embodiments.

At step 1102, a class-D amplifier is provided. The class-D amplifier includes an output driver stage and a current sensing circuit.

At step 1104, a first output voltage across the positive output terminal and the negative output terminal of the operational amplifier is measured for a first period, when the first p-type output transistor is turned off, the first n-type output transistor is turned on, the second p-type output transistor is turned on, and the second n-type output transistor is turned off.

At step 1106, a second output voltage across the positive output terminal and the negative output terminal of the operational amplifier is measured for a second period, when the first p-type output transistor is turned on, the first n-type output transistor is turned off, the second p-type output transistor is turned on, and the second n-type output transistor is turned off.

At step 1108, a third output voltage across the positive output terminal and the negative output terminal of the operational amplifier is measured for a third period, when the first p-type output transistor is turned off, the first n-type output transistor is turned on, the second p-type output transistor is turned off, and the second n-type output transistor is turned on.

At step 1110, a sensed load current is determined based on the first output voltage, the second output voltage, and the third output voltage.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A class-D amplifier, comprising:
an output driver stage comprising:
a first pull-up output transistor, wherein a drain or source of the first pull-up output transistor is connected to a higher power rail;
a first n-type output transistor, wherein a drain of the first n-type output transistor is connected to a drain or source of the first pull-up output transistor at a first output terminal, and a source of the first n-type output transistor is connected to a lower power rail;
a second pull-up output transistor, wherein a drain or source of the second pull-up output transistor is connected to the higher power rail; and
a second n-type output transistor, wherein a drain of the second n-type output transistor is connected to a drain or source of the second pull-up output transistor at a second output terminal, and a source of the second n-type output transistor is connected to a lower power rail; and
a current sensing circuit connected to the first output terminal and the second output terminal and comprising:
an operational amplifier having a positive input terminal and a negative input terminal;
a positive input replica transistor, wherein a source of the positive input replica transistor is connected to the positive input terminal of the operational amplifier, a drain of the positive input replica transistor is connected to the drain of the first n-type output transistor, and a gate of the positive input replica transistor is connected to a gate of the first n-type output transistor; and a negative input replica transistor, wherein a source of the negative input replica transistor is connected to the negative input terminal of the operational amplifier, a drain of the negative input replica transistor is connected to the drain of the second n-type output transistor, and a gate of the negative input replica transistor is connected to a gate of the second n-type output transistor.

2. The class-D amplifier of claim 1, wherein the operational amplifier further has a positive output terminal and a negative output terminal, and the current sensing circuit further comprises:
a first feedback resistor and a first feedback capacitor connected in parallel between the negative input terminal and the positive output terminal of the operational amplifier; and
a second feedback resistor and a second feedback capacitor connected in parallel between the positive input terminal and the negative output terminal of the operational amplifier.

3. The class-D amplifier of claim 2, wherein the first feedback resistor and the second feedback resistor have the same resistance, and the first feedback capacitor and the second feedback capacitor have the same capacitance.

4. The class-D amplifier of claim 2, wherein the positive output terminal and the negative output terminal of the operational amplifier are connected to an analog to digital converter (ADC).

5. The class-D amplifier of claim 1, wherein the first n-type output transistor is characterized by a first channel width and a first channel length, and the positive input replica transistor is characterized by a second channel width and a second channel length, and wherein a first ratio of the first channel width to the first channel length is different from a second ratio of the second channel width to the second channel length.

6. The class-D amplifier of claim 5, wherein the first channel width is larger than the first channel length, and the second channel width is smaller than the second channel length.

7. The class-D amplifier of claim 5, wherein the second n-type output transistor is characterized by a third channel width and a third channel length, and the negative input replica transistor is characterized by a fourth channel width and a fourth channel length, and wherein a third ratio of the third channel width to the third channel length is different from a fourth ratio of the fourth channel width to the fourth channel length.

8. The class-D amplifier of claim 7, wherein the third channel width is larger than the third channel length, and the fourth channel width is smaller than the fourth channel length.

9. The class-D amplifier of claim 8, wherein the first n-type output transistor, the second n-type output transistor, the positive input replica transistor, and the negative input replica transistor are located at a same chip.

10. The class-D amplifier of claim 9, wherein the first n-type output transistor, the second n-type output transistor, the positive input replica transistor, and the negative input replica transistor are fabricated at a same process corner.

11. The class-D amplifier of claim 2, wherein the current sensing circuit further comprises:
a first inverter, an input terminal of the first inverter connected to the gate of the first n-type output transistor; and
a positive secondary replica transistor, wherein a source of the positive secondary replica transistor is connected to the source of the positive input replica transistor at the positive input terminal of the operational amplifier, a drain of the positive secondary replica transistor is connected to the lower power rail, and a gate of the positive secondary replica transistor is connected to an output terminal of the first inverter.

12. The class-D amplifier of claim 11, wherein the current sensing circuit further comprises:
a second inverter, an input terminal of the second inverter connected to the gate of the second n-type output transistor; and
a negative secondary replica transistor, wherein a source of the negative secondary replica transistor is connected to the source of the negative input replica transistor at the negative input terminal of the operational amplifier, a drain of the negative secondary replica transistor is connected to the lower power rail, and a gate of the negative secondary replica transistor is connected to an output terminal of the second inverter.

13. The class-D amplifier of claim 7, wherein a positive secondary replica transistor is characterized by a fifth channel width and a fifth channel length, and wherein a fifth ratio of the fifth channel width to the fifth channel length is the same as the second ratio of the second channel width to the second channel length.

14. The class-D amplifier of claim 13, wherein a negative secondary replica transistor is characterized by a sixth channel width and a sixth channel length, and wherein a sixth ratio of the sixth channel width to the sixth channel length is the same as the fourth ratio of the fourth channel width to the fourth channel length.

15. The class-D amplifier of claim 14, wherein the positive input replica transistor, the negative input replica transistor, the positive secondary replica transistor, and the negative secondary replica transistor are fabricated at a same process corner.

16. A method for operating a class-D amplifier, comprising:
providing a class-D amplifier, the class-D amplifier comprising:
an output driver stage comprising:
a first pull-up output transistor, wherein a source or drain of the first pull-up output transistor is connected to a higher power rail;
a first n-type output transistor, wherein a drain of the first n-type output transistor is connected to a drain or source of the first pull-up output transistor at a first output terminal, and a source of the first n-type output transistor is connected to a lower power rail;
a second pull-up output transistor, wherein a source or drain of a second p-type output transistor is connected to the higher power rail; and
a second n-type output transistor, wherein a drain of the second n-type output transistor is connected to a drain or source of the second pull-up output transistor at a second output terminal, and a source of the second n-type output transistor is connected to a lower power rail; and
a current sensing circuit connected to the first output terminal and the second output terminal and comprising:
an operational amplifier having a positive input terminal and a negative input terminal;
a positive input replica transistor, wherein a source of the positive input replica transistor is connected to the positive input terminal of the operational amplifier, a drain of the positive input replica transistor is connected to the drain of the first n-type output transistor, and a gate of the positive input replica transistor is connected to a gate of the first n-type output transistor; and a negative input replica transistor, wherein a source of the negative input replica transistor is connected to the negative input terminal of the operational amplifier, a drain of the negative input replica transistor is connected to the drain of the second n-type output transistor, and a gate of the negative input replica transistor is connected to a gate of the second n-type output transistor;

measuring a first output voltage across a positive output terminal and a negative output terminal of the operational amplifier for a first period, when the first pull-up output transistor is turned off, the first n-type output transistor is turned on, the second pull-up output transistor is turned on, and the second n-type output transistor is turned off;

measuring a second output voltage across the positive output terminal and the negative output terminal of the operational amplifier for a second period, when the first pull-up output transistor is turned on, the first n-type output transistor is turned off, the second pull-up output transistor is turned on, and the second n-type output transistor is turned off; and measuring a third output voltage across the positive output terminal and the negative output terminal of the operational amplifier for a third period, when the first pull-up output transistor is turned off, the first n-type output transistor is turned on, the second pull-up output transistor is turned off, and the second n-type output transistor is turned on.

17. The method of claim 16, further comprising:
determining a sensed load current based on the first output voltage, the second output voltage, and the third output voltage.

18. The method of claim 17, wherein the first n-type output transistor is characterized by a first channel width and a first channel length, and the positive input replica transistor is characterized by a second channel width and a second channel length, and wherein a first ratio of the first channel width to the first channel length is different from a second ratio of the second channel width to the second channel length.

19. The method of claim 18, wherein the second n-type output transistor is characterized by a third channel width and a third channel length, and the negative input replica transistor is characterized by a fourth channel width and a fourth channel length, and wherein a third ratio of the third channel width to the third channel length is different from a fourth ratio of the fourth channel width to the fourth channel length.

20. A class-D amplifier with embedded current sensing, comprising:
an output driver stage comprising:
a first pull-up output transistor, wherein a source or drain of a first p-type output transistor is connected to a higher power rail;
a first n-type output transistor, wherein a drain of the first n-type output transistor is connected to a drain or source of the first pull-up output transistor at a first output terminal, and a source of the first n-type output transistor is connected to a lower power rail;
a second pull-up output transistor, wherein a source or drain of the second pull-up output transistor is connected to the higher power rail; and
a second n-type output transistor, wherein a drain of the second n-type output transistor is connected to a drain or source of the second pull-up output transistor at a second output terminal, and a source of the second n-type output transistor is connected to a lower power rail; and
a current sensing circuit connected to the first output terminal and the second output terminal and comprising:
an operational amplifier having a positive input terminal and a negative input terminal;
a positive input replica transistor connected between the drain of the first n-type output transistor and the positive input terminal; and
a negative input replica transistor connected between the drain of the second n-type output transistor and the negative input terminal.

* * * * *